United States Patent [19]

Lagoni

[11] Patent Number: 5,099,154
[45] Date of Patent: Mar. 24, 1992

[54] AMPLIFIER ARRANGEMENT FOR PRODUCING A CONTROLLABLE NON-LINEAR TRANSFER CHARACTERISTIC USEFUL FOR IMPROVING THE CONTRAST OF AN IMAGE

[75] Inventor: William A. Lagoni, Indianapolis, Ind.

[73] Assignee: Thomson Consumer Electronics, Inc., Indianapolis, Ind.

[21] Appl. No.: 398,847

[22] Filed: Aug. 25, 1989

[51] Int. Cl.$^5$ .......................... G06G 7/12; H03L 5/00
[52] U.S. Cl. .................................... 307/490; 307/264; 307/239; 328/135; 328/142; 328/169
[58] Field of Search ............... 307/490, 493, 494, 259, 307/242, 239, 243, 264, 360; 358/27, 181; 328/135, 169, 142, 143

[56] References Cited

U.S. PATENT DOCUMENTS

| | | | |
|---|---|---|---|
| 2,760,008 | 8/1956 | Schade | 330/95 |
| 2,892,025 | 6/1959 | Luther, Jr. et al. | 358/32 |
| 3,226,475 | 12/1965 | Percival | 358/32 |
| 3,277,318 | 10/1966 | Bedford | 307/259 |
| 3,702,898 | 11/1972 | Webb | 307/259 |
| 3,786,183 | 1/1974 | Satterfield | 358/126 |
| 3,835,243 | 9/1974 | Nagaoka | 358/36 |
| 4,245,237 | 1/1981 | Lagoni | 358/31 |
| 4,363,033 | 12/1982 | Lovely | 307/259 |
| 4,489,349 | 12/1984 | Okada | 358/168 |
| 4,710,805 | 12/1987 | Markle et al. | 358/81 |
| 4,712,132 | 12/1987 | Soca | 358/37 |

Primary Examiner—Stanley D. Miller
Assistant Examiner—Trong Phan
Attorney, Agent, or Firm—Joseph S. Tripoli; Peter M. Emanuel; Frederick A. Wein

[57] ABSTRACT

The present invention concerns a non-linear transfer function generator, e.g., for implementating "white stretch" of a luminance signal. Specifically, first and second emitter-follower amplifiers have their inputs coupled in parallel and their outputs coupled in series via first resistor of a voltage divider. A second resistor of the voltage divider is coupled to a point of reference potential. A bias source is coupled to the second amplifier, e.g., via the second resistor of the voltage divider, so that the dynamic response of the second amplifier to an input signal is limited with respect to the first amplifier. The output signal of the first amplifier is linear and an output signal developed at the output of the second amplifier is non-linear. The linear and non-linear output signals are combined by a current steering network in response to a control signal representative of a characteristic of a processed version of the luminance signal.

3 Claims, 5 Drawing Sheets

AMPLIFIER ARRANGEMENT FOR PRODUCING A CONTROLLABLE NON-LINEAR TRANSFER CHARACTERISTIC USEFUL FOR IMPROVING THE CONTRAST OF AN IMAGE

RELATED APPLICATIONS

The present application is related to concurrently filed U.S. patent application Ser. No. 398,845, entitled "A DYNAMIC VIDEO SYSTEM INCLUDING AUTOMATIC CONTRAST AND 'WHITE-STRETCH' PROCESSING SECTIONS", and concurrently filed U.S. patent application Ser. No. 398,849, entitled CONTROL SIGNAL GENERATOR FOR A TELEVISION SYSTEM, all three applications having the same inventor and assignee.

FIELD OF THE INVENTION

The present invention relates to a controllable non-linear processing circuit, and more particularly to such a circuit for enhancing the contrast of a video image.

BACKGROUND OF THE INVENTION

In concurrently filed U.S. patent application Ser. No. 398,845, entitled "A Dynamic Video System Including Automatic Contrast and 'White-Stretch' Processing Sections", referred to above, the advantages of using a "white-stretch" processing section in a television system are disclosed. White-stretch emphasizes or boosts the amplitudes of mid-range luminance amplitudes relative to high luminance amplitudes as a function of a control signal representing an image characteristic in order to enhance the contrast of the reproduced image. The advantages of white stretch processing are briefly discussed in the present application. However, the present application primarily concerns an advantageous arrangement for providing a controllable non-linear gain characteristic which may be employed to produce white-stretch.

SUMMARY OF THE INVENTION

According to an aspect of the invention, the non-linear processing apparatus includes first and second amplifiers arranged for producing linear and non-linear output signals in response to an input signal and a "soft-switch" for combining the output signals in accordance with a control signal. Specifically, in accordance with another aspect of the invention, the first and second amplifiers comprise voltage-followers having their inputs coupled in parallel and their outputs coupled together by a first resistor of a resistive voltage divider. A bias voltage is coupled to the second amplifier so that the second amplifier will be cut-off before the first amplifier. Before the second amplifier cuts-off, the output signals provided by the amplifiers have the same amplitude and no current flows through the first resistor. After the second amplifier cuts-off, current flows through the first resistor, and by voltage division action of the voltage divider, an attenuated version of the output signal of the first amplifier is developed at the output of the second amplifier. As a result, a linear output signal is produced at the output of the first amplifier and a non-linear output signal is produced at the output of the second amplifier.

BRIEF DESCRIPTION OF THE DRAWINGS

For a detailed understanding of the present invention, reference should be made to the accompanying drawings in which.

In the FIGURES, the same reference numbers have been assigned to the same or similar elements.

DETAILED DESCRIPTION OF THE PREFERRED EMBODIMENT

In the following description, it is assumed that positive-going portions of the luminance signal correspond to white-going portions of a reproduced image.

Figure 1A:
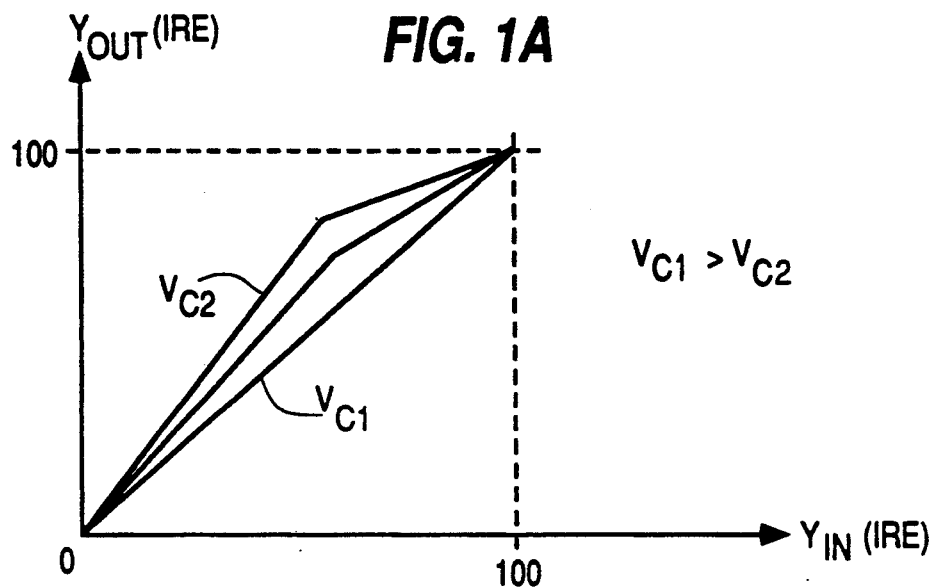
FIGS. 1A and 1B respectively show a white-stretch gain characteristic and a block diagram of apparatus having a white-stretch transfer function.

Turning now to FIG. 1A, a white stretch gain characteristic is shown. The gain characteristic includes a family of non-linear transfer functions having an increased gain (slope) for mid-range and lower level luminance amplitude levels compared with high luminance amplitude levels. The degree of non-linearity increases as an inverse function of the magnitude of a control signal $V_C$. For the highest magnitude ($V_{C1}$) of control signal $V_C$, the gain characteristic collapses to a linear transfer function. For lower magnitudes (e.g., $V_{C2} < V_{C1}$), the transfer functions become more non-linear.

Figure 1B:
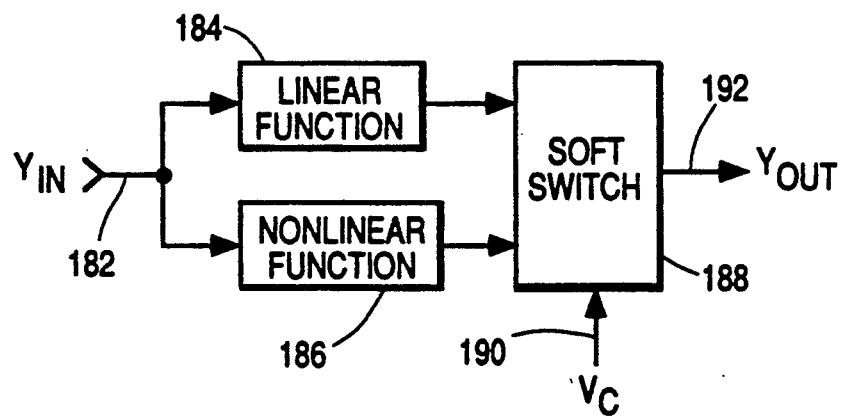

An effective way of generating the transfer function of FIG. 1A is shown in FIG. 1B. An input voltage at an input 182 is coupled in parallel to the input of a linear amplifier 184 and to the input of a nonlinear amplifier 186. The output signals of amplifiers 184, 186 are coupled to a "soft-switch" 188, which combines the linear and non-linear output signals in accordance with control voltage $V_C$ to develop a final output signal at an output 192. The gain characteristic between input 182 and output 192 is that shown in FIG. 1A.

Figure 2A:
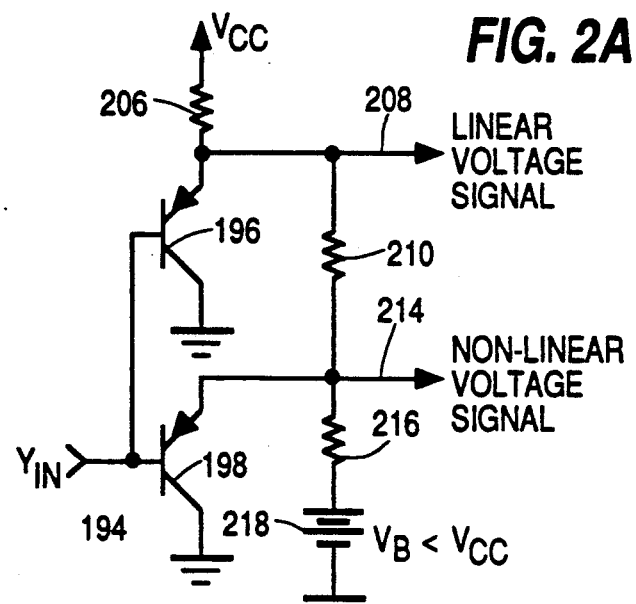
FIGS. 2A and 2B respectively show a schematic of an arrangement of first and second amplifiers for implementing certain blocks of the apparatus of FIG. 1B and associated transfer functions.
Figure 2B:
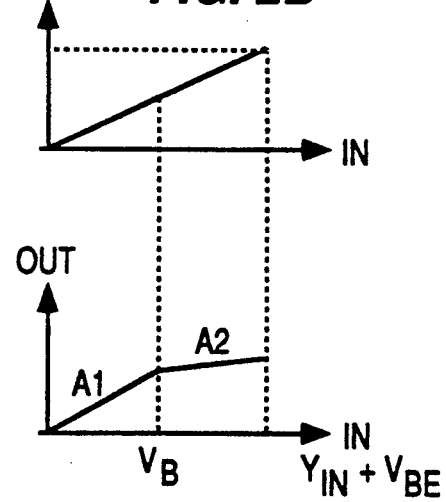

The implementation of amplifiers 184 and 186 of the block diagram of FIG. 1B is shown schematically in FIG. 2A. The transfer functions for the amplifiers of FIG. 2A is shown in FIG. 2B.

The luminance signal voltage at input 194 (corresponding to the input voltage 182 of FIG. 1B) is coupled in parallel to the bases of PNP transistors 196 and 198 Transistors 196, 198 are configured as emitter followers, with respective collectors connected to ground and output voltages developed at respective emitters. The emitter of PNP transistor 196 is connected to the source of supply voltage $V_{CC}$ through resistor 206 and develops an output signal across resistor 206 at output 208. Emitter-follower 198 develops an output voltage across the series connection of a load resistor 216 and a bias voltage supply 218 at output 214. The value of the bias voltage provided by bias voltage supply 218 is set so that transistor 198 is cut-off at a desired break point level ($V_B$) of the input signal. Transistor 196 continues to conduct after the break point level. As a result, emitter-follower 198 has a smaller dynamic range than emitter-follower 196. A resistor 210 is connected between outputs 208 and 214.

While transistor 198 is conducting, the output voltages at 208 and 214 are substantially identical and are linearly related to the input voltage. In addition, no attenuation of the output signal at 208 occurs since no current, flows through resistor 210. However, when transistor 198 turns off, current flows through resistor 210. At and beyond that point ($V_B$), the output signal at 208 continues to be unaltered, but an attenuated version of the output signal at 208 is produced at 214 due to the voltage division between resistors 210 and 216. Break point $V_B$ is determined by voltage supply 218 and the DC bias existing at the base of transistor 198. The ratio of the slopes of $A_2$ and $A_1$ shown in FIG. 2B is determined by the ratio of resistors 210 and 216.

Figure 3A:
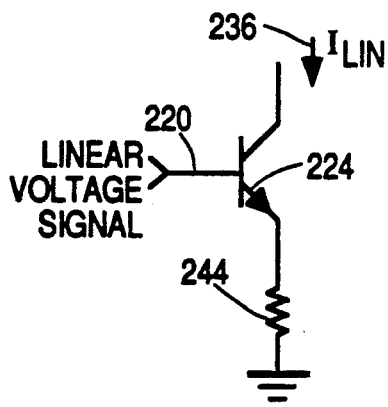
FIGS. 3A and 3B show current sources also utilized in the implementation of the apparatus of FIG. 1B.
Figure 3B:
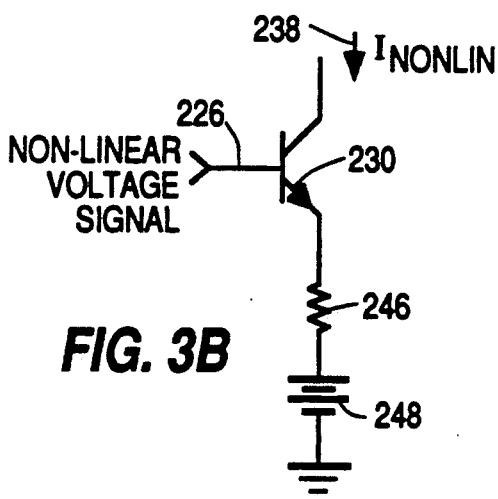

FIGS. 3A and 3B show schematics of circuits for converting the output voltages of FIG. 2A to currents. These currents are applied to "soft-switch" 188 comprising a current steering network, as will be explained below. As shown in FIG. 3A the linear voltage signal developed at output 208 is applied to one input 220 which is coupled to the base of a transistor 224. In a corresponding manner, the non-linear voltage signal developed at output 213 is applied to an input 226 which is coupled to the base of a transistor 230. Transistors 224 and 230 have their respective collectors coupled to the current steering circuit discussed in connection with FIG. 4. In response to the voltages applied to the bases of transistors 224 and 230, respective collector currents 236 and 238 are developed. The emitters of transistors 224 and 230 are connected to respective emitter resistors 244 and 246. Resistor 244 is coupled directly to ground and resistor 246 is coupled to ground through bias voltage source 248. Resistor 246 has a lower value than resistor 244 in order to equalize the black to white difference of the linear and non-linear signals currents. The bias provided by bias voltage 248 introduces an offset used to equalize the DC components of the two output currents.

Figure 4:
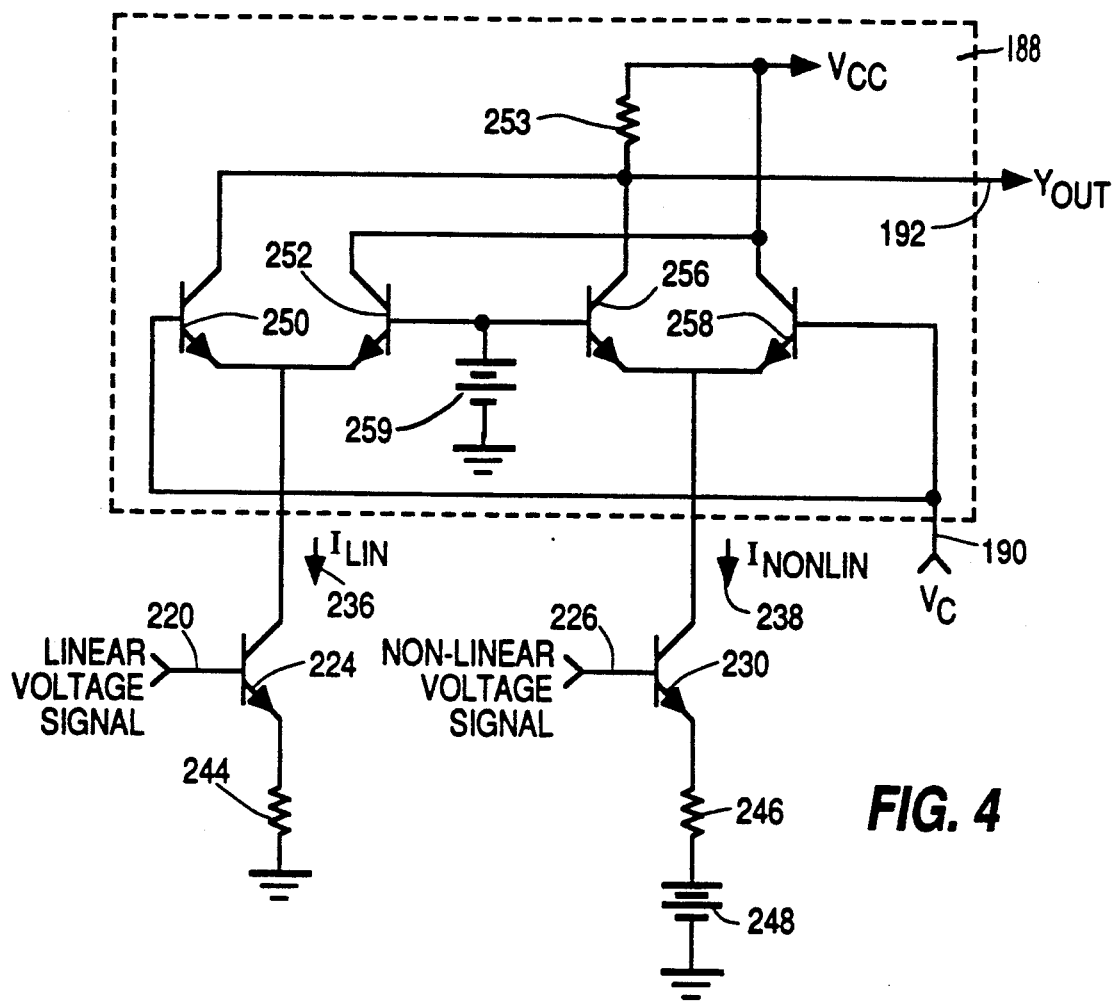
FIG. 4 shows a schematic of a current steering network for implementing another block of the apparatus of FIG. 1B.

Soft-switch 188 can be implemented as current steering differential amplifiers as shown in FIG. 4. Transistors 224 and 230 operate in the same manner discussed above in connection with FIGS. 3A and 3B. Transistors 250 and 252 form a differential amplifier configuration for steering current 236 flowing in the collector of transistor 224 between signal output terminal 192, to which a load resistor 253 is connected for developing an output voltage, or to power supply $V_{CC}$, as a function of control voltage $V_C$ applied to the base of transistor 250. Differential transistor pair 256, 258 similarly steers current 238 flowing in the collector of transistor 230 as a function of control voltage $V_C$ applied to the base of transistor 258. As a result, the current flowing through load resistor 253 is a controllable combination of linear and non-linear currents 236, 238.

A voltage source 259 coupled to the bases of transistors 252, 256 establishes the range in which current steering is continuously controllable. As is known, the range of differential input voltage for which the output current of a differential amplifier will respond to the input voltage is about +150 millivolts. The voltage provided by voltage source 259 corresponds to approximately the middle of control range. For magnitudes of control voltage $V_C$ below the voltage provided by source 259, transistor 256 conducts more heavily than transistor 258 and transistor 252 conducts more heavily than transistor 250. As a result, the output voltage developed across load resistor 253 has a greater contribution from the non-linear current (provided by transistor 230) than from the linear current (provided by transistor 224). For magnitudes of control voltage $V_C$ above the voltage provided by source 259, transistor 250 conducts more heavily than transistor 252 and transistor 258 conducts more heavily than transistor 256. As a result, the output voltage developed across load resistor has a greater contribution from the linear current provided by transistor 224 than from the non-linear current provided by transistor 230. Accordingly, the gain characteristic between input 182 and output 192 is as shown in FIG. 1A.

Figure 5:
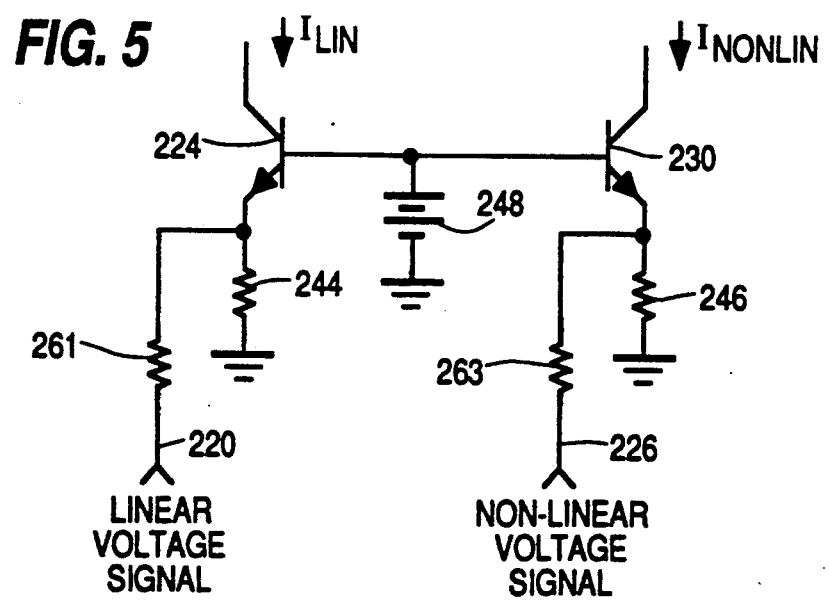
FIG. 5 shows alternate current sources which may be utilized in place of those shown in FIGS. 3A and 3B.

The circuit of FIG. 4 produces a signal inversion between input 182 and output 192. In some applications this signal inversion is undesirable. An alternative arrangement for the current sources shown in FIGS. 3A, 3B and 4, which does not result in a signal inversion, is shown in FIG. 5. In this arrangement, the input voltages applied to inputs 220 and 226 are coupled to the respective emitters of transistors 224 and 230 instead of coupling to the respective bases. Inputs 220 and 226 are coupled to the respective emitters of transistors 224, 230 through respective resistors 261 and 263. Also, in the circuit of FIG. 5, bias voltage source 248 is coupled to the bases of the transistors 224 and 230. Resistor 261 has a higher value than resistor 263 to compensate for the black to white difference between the two input voltages developed at 220 and 226, and resistor 246 is made smaller than resistor 244 to compensate for the difference between the DC components of the two input voltages.

Figure 6:
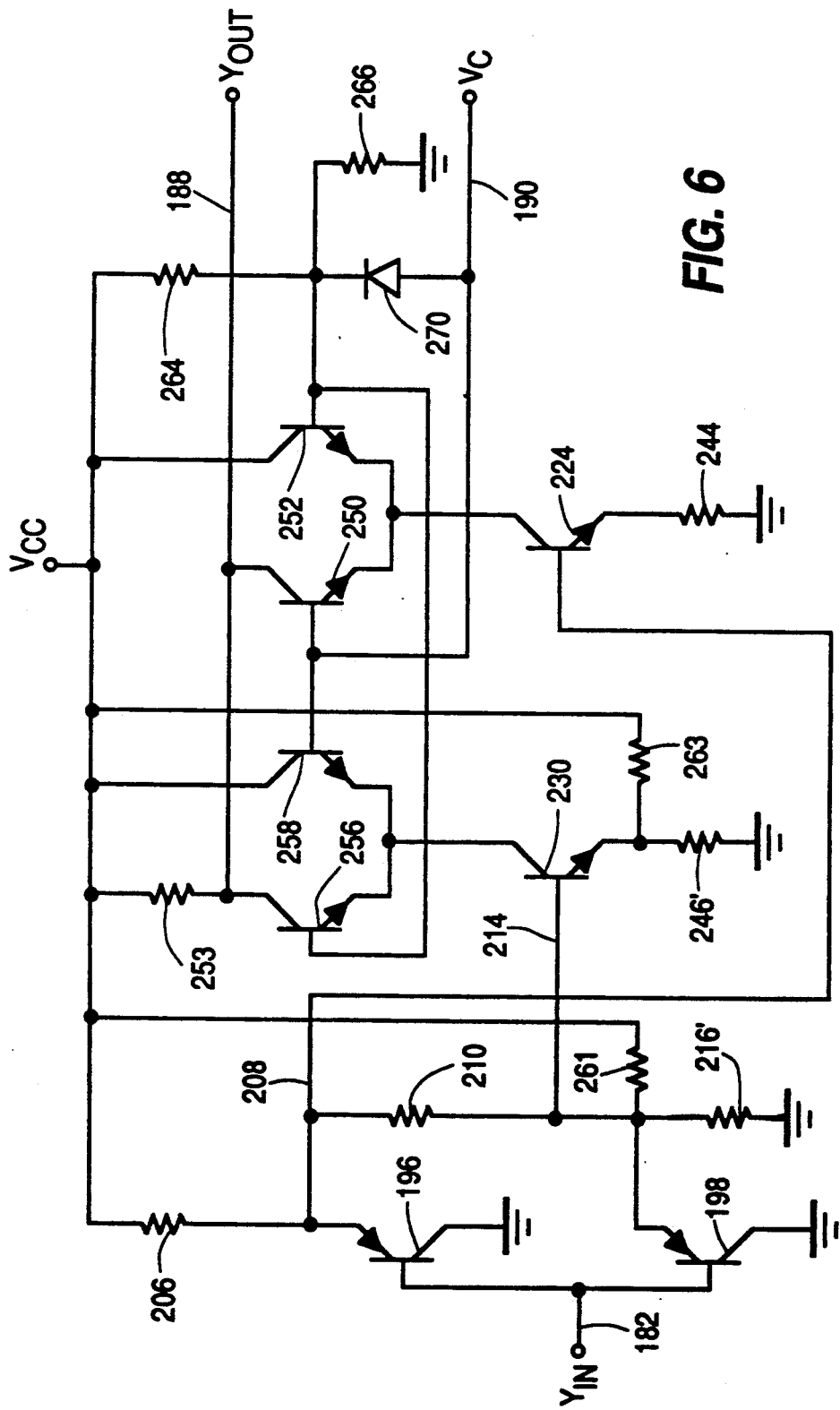
FIG. 6 shows a schematic of the complete implementation of the apparatus of FIG. 1B utilizing portions shown in FIGS. 2A and 3A, 3B and 4.

FIG. 6 shows the complete implementation of the block diagram of FIG. 1B. FIG. 6 shows the circuit portions previously discussed in connection with FIGS. 2A, 3A, 3B and 4 coupled together. However, certain practical modifications have been made.

In the later regard, bias voltage source 218 associated with emitter follower 198 as shown in FIG. 2A, is provided (as a Thevenin's voltage source) by the voltage division of supply voltage $V_{CC}$ between a resistor 261 and a resistor 216'. Resistor 216 shown in FIG. 2A corresponds to the Thevenin's equivalent of resistors 216' and 261. In like manner bias voltage 248 associated with the current source for the non-linear input voltage as shown in FIGS. 3B and 4, is provided by the voltage division of supply voltage $V_{CC}$ between a resistor 263 and a resistor 246'. A voltage divider including resistors 264 and 266 correspond to voltage source 259 coupled to the bases of transistors 252 and 256 as shown in FIG. 4. Perhaps of greater significance, is the addition of a diode 270 coupled between $V_C$ control input 190 and the junction of resistors 264 and 266 with a sense for preventing control voltage $V_C$ from exceeding one diode voltage drop above the voltage developed at the junction of resistors 264 and 266. This prevents distortion in the output signal ($Y_{OUT}$) at high magnitudes of control voltage $V_C$.

Figure 7:
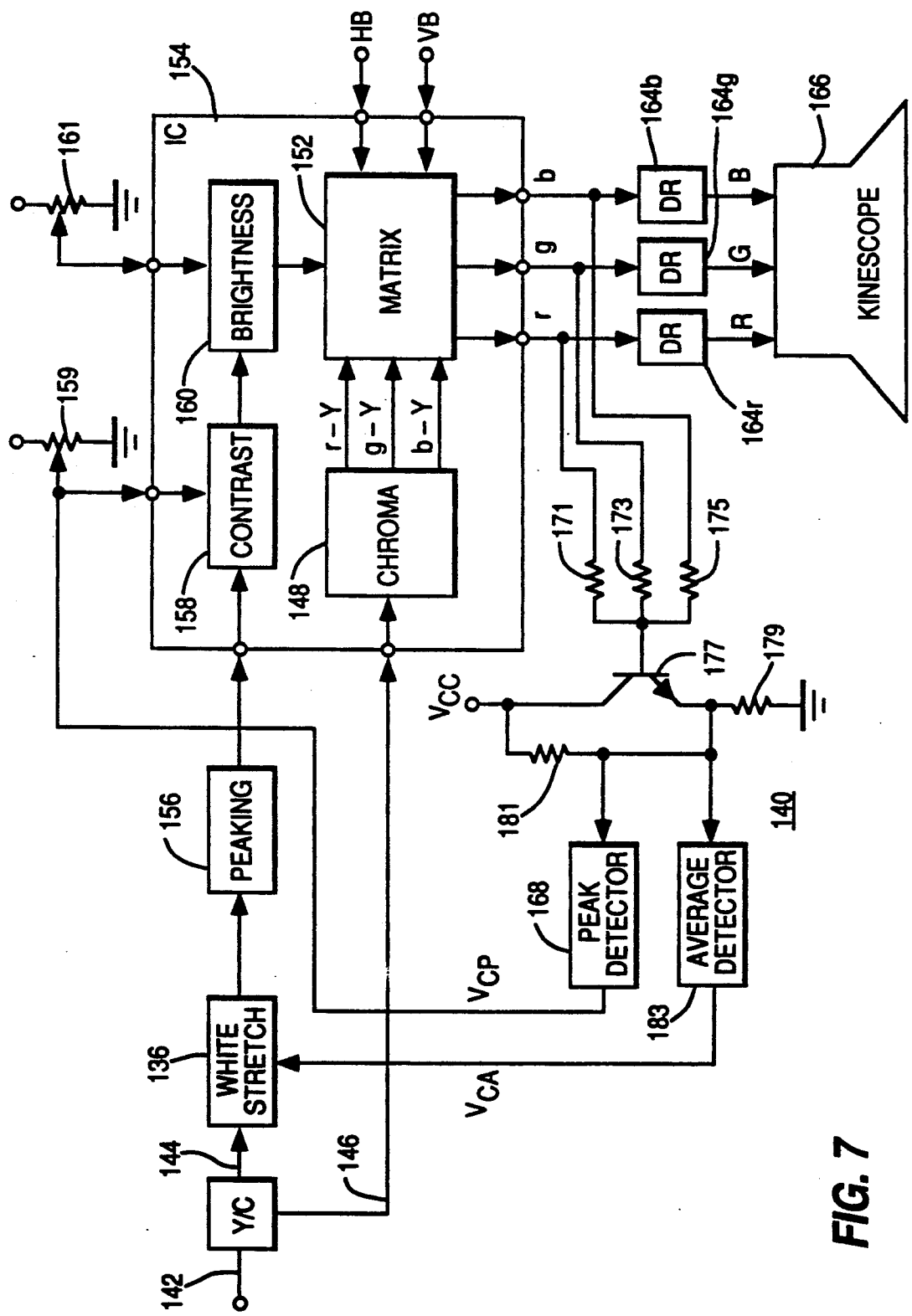
FIG. 7 shows how the white stretch apparatus of FIG. 1B may be utilized in a television system.

The manner in which the controllable non-linear gain characteristic signal processing circuitry described with reference to FIGS. 1-6 may be employed in a television system to perform white-stretch processing is shown in FIG. 7. With reference to FIG. 7, the non-linear gain characteristic circuitry is incorporated within a white-stretch processing unit 136. The control voltage for white-stretch processing unit 136 (indicated as control signal $V_{CA}$ in connection with FIG. 7 is produced by a control signal generator 140, as will be explained below.

Specifically with respect to FIG. 7, a composite video provided at an input 142 is separated into two components: a luminance signal provided at an output 144, and a chrominance signal provided at an output 146.

The chrominance signal is processed in a well known manner in processor 148 for producing red, green and blue color difference signals r-Y, b-Y and g-Y. The color difference signals are coupled to a matrix 152. Chrominance processing unit 148 and matrix 152 may be included in an integrated circuit (IC) 154.

The luminance signal is coupled to white stretch processing unit 136 which also receives the control signal $V_{CA}$ generated by generator 140. The output signal of white-stretch processing unit 136 is coupled to a peaking circuit 156 for improving the sharpness of the image. The output signal of peaking circuit 156 is coupled to integrated circuit 154.

For luminance signal processing, integrated circuit 154 includes contrast control unit 158 and a brightness control unit 160. User adjustment elements for contrast and brightness are symbolically represented by potentiometers 159 and 161, respectively, although in modern televisions systems, they commonly include microprocessor controlled digital-to-analog converters. The processed luminanace signal is coupled to matrix 152 where it is combined with the color difference signals to produce low level red(r), green(g) and blue(b) color signals. Horizontal and vertical retrace blanking pulses, HB and VB, respectively, generated in a deflection processing section (not shown), are inserted, by matrix 152 in the r,g,b color signals in order to prevent the display of horizontal and vertical retrace lines.

The low level r, g, b color signals are amplified by drive amplifiers 164r, 164g, and 164b, to produce R, G, B drive signals suitable for driving respective cathodes of a kinescope 166.

In order to prevent spot blooming, as well as display driver and phosphor saturation, due to excessive white-going signal peaks, corresponding, e.g., to characters, a peak detector 168 detects the white-going peaks of a luminance-representative signal, generated within control signal generator 140 as will be explained below, and, in response, generates a control signal for contrast control unit 158. Whenever white-going peaks exceeding a threshold corresponding to spot blooming are detected, the contrast is automatically reduced.

Unfortunately, the automatic contrast control apparatus affects all amplitudes uniformly since contrast control unit 158 has a linear gain transfer function. As a result, mid-range as well as high amplitudes tend to be reduced, resulting in a reduction of the subjective brightness of the image. White-stretch processing unit 136 counteracts this action in the following way.

The control signal (voltage), $V_{CA}$, for white stretch processing unit 136 is derived in response to the average value of the luminance-representative signal to be discussed below. When the average image brightness is low, control signal $V_{CA}$ causes the degree of non-linearity of white stretch processing unit 136 to be increased (see FIG. 1A for $V_{C2}$). As a result, mid-range amplitudes of the luminance signal are increased relative to high amplitude levels. Since white-going peaks corresponding to small image areas do not significantly affect the average level, an automatic contrast reduction in response to excessive white-going peaks, tending to further reduce mid-range amplitudes, will be compensated for by the white stretch gain increase applied to mid-range amplitudes. In this way, spot blooming, as well as display driver and phosphor saturation, are minimized while providing subjectively sharp, bright images.

As earlier noted, for automatic contrast and white stretch control it is desirable to detect the peak and average, respectively, of a signal representing the luminance component of the reproduced image after image characteristics, such as contrast and brightness, have been adjusted so that the respective control signals will properly reflect the content of the reproduced image. The TA7730 luminance processing IC commercially available from Toshiba provides at an output terminal a luminance-representative signal derived by combining r,g,b color signals which have been subjected to contrast and brightness control. Unfortunately, a luminance or luminance representative signal reflecting contrast and brightness control processing is not provided by other ICs, e.g., such as the TDA4580 available from Valvo, as is indicated with respect to IC 154 in FIG. 1.

Control signal generator 140, with which the concurrently filed Lagoni patent application entitled "CONTROL SIGNAL GENERATOR FOR A TELEVISION SYSTEM" is particularly concerned is directed to this problem. Control signal generator 140 combines the r,g,b color signals produced at respective output terminals of IC 154 to produce a signal at least approximately representing processed luminance information. However, the resulting "summed luminance" signal contains pulses corresponding to the high level (e.g., in the range of $-100$ to $-160$ IRE) retrace blanking pulses contained in the r,g,b signals which are combined, unlike the summed luminance signal produced by the TA7730 IC, in which r,g,b signals are combined before retrace blanking pulses are added. The pulses contained in a summed luminance signal extend significantly below the black level and will therefore substantially affect the average value (as well as the peak-to-peak value). Accordingly, a control signal derived by detecting the average value of the summed signal would not accurately represent the brightness of the reproduced image. Control signal generator 140 also includes provisions directed to this problem.

Specifically, with respect to control signal generator 140, the r,g,b color signals produced at respective output terminals of IC 154 are summed by means of a resistive combiner comprising resistors 171, 173, 175. The resultant summed signal, produced at the common junction of resistor 171, 173, 175, is coupled to the base of an emitter-follower amplifier 177. An output signal is developed across a load resistor 179 at the low impedance emitter output of emitter-follower 177.

A resistor 181 coupled between a supply voltage source ($V_{CC}$) and the emitter of emitter follower 177 raises the conduction threshold of emitter-follower 177 so that substantially the entirety of the white-going summed signal above the black level is provided at the emitter output, but the pulses, corresponding to the retrace blanking pulses of the r,g,b, color signals, are removed. Thus, due to the increased bias applied to the emitter, the detected average value and the resultant white-stretch control signal, $V_{CA}$, are relatively reliable representations of the average luminance component of the reproduced image.

While resistors 171, 173 and 175 can be proportioned according to the well known luminance matrix equation to accurately produce a luminance signal, a ratio of 1:1:1 has been found to be adequate in practice for providing a processed luminance-representative component suitable for white-stretch processing control.

The average value of the summed output signal is developed by an average detector 183, which may simply comprise an R-C low pass filter. The value of the white peaks of the summed output signal are detected by peak detector 168. A suitable peak detector, which is capable of responding to very sharp peaks, is disclosed in U.S. patent application Ser. No. 380,697 entitled "Peak Detector With Feedback", filed on July 14, 1989 in the name of G. A. Whitledge and assigned to the same assignee as that of the present application.

While there has been illustrated and described what is at present considered to be a preferred embodiment of the present invention, it will be appreciated that changes and modifications may occur to those skilled in the art. For example, while amplifiers 184 and 186 shown in block form in FIG. 1B are illustratively implemented as emitter-followers as shown in FIG. 2A, other follower amplifiers and other amplifier configurations may be employed. It is intended that the following claims cover all of such and other modifications which fall within the scope of the present invention.

I claim:

1. Signal processing apparatus comprising:
    means for supplying an input signal
    a first amplifier having a first input to which said input signal is coupled and a first output; said first amplifier producing a first output signal at said first output which is a linear representation of said input signal for a given amplitude range of said input signal;
    a second amplifier having a second input to which said input signal is coupled and a second output; said second amplifier producing a second output signal at said second output which is a linear representation of said input signal for a first portion of said given amplitude range of said input signal and being inhibited from producing an output signal for a second portion of said given amplitude range;
    a voltage divider having first and second ends and a tap point between said first and second ends;
    said first output of said first amplifier being coupled to said first end of said voltage divider; a first intermediary signal being produced at said first end of said voltage divider which corresponds to said first output signal produced of said first amplifier;
    said second output of said second amplifier being coupled to said tap of said voltage divider; a second intermediary signal being produced at said tap point of said voltage divider which corresponds to said second output signal of said second amplifier for said first portion of said given amplitude range of said input signal and which corresponds to a voltage divided version of said first output signal for said second portion of said given amplitude range of said input signal; and
    means for combining said first and second intermediary signals to produce a combined signal.

2. The apparatus recited in claim 1 wherein said means for combining includes means for controlling the amplitudes of said first and second intermediary signals in response to a control signal; and means for combining said amplitude controlled versions of said first and second intermediary signals.

3. The apparatus recited in claim 1 wherein each of said first and second amplifiers comprises a follower amplifier.

* * * * *

UNITED STATES PATENT AND TRADEMARK OFFICE
CERTIFICATE OF CORRECTION

PATENT NO. : 5,099,154
DATED : March 24, 1992
INVENTOR(S) : William Adamson Lagoni It is certified that error appears in the above-identified patent and that said Letters Patent is hereby corrected as shown below:

On the title page: the following should be inserted under [56] References Cited, U.S. PATENT DOCUMENTS:

-- 2,692,333  10/1954  Holmes .................. 250/27 --

-- 3,752,905  8/1973  Schneider ............... 178/5.4 R --

-- 4,507,615  3/1985  Bateman ................. 328/142 -- and other FOREIGN PATENT DOCUMENTS:

--0223295  5/1987 European Pat. Off. --

--2106746  4/1983 United Kingdom --

Signed and Sealed this

Twenty-first Day of September, 1993

Attest:

BRUCE LEHMAN

Attesting Officer    Commissioner of Patents and Trademarks